United States Patent
Sato et al.

(10) Patent No.: US 8,703,000 B2
(45) Date of Patent: Apr. 22, 2014

(54) SLIMMING METHOD OF CARBON-CONTAINING THIN FILM AND OXIDATION APPARATUS

(75) Inventors: Jun Sato, Nirasaki (JP); Masayuki Hasegawa, Oshu (JP)

(73) Assignee: Tokyo Electron Limited (JP)

( * ) Notice: Subject to any disclaimer, the term of this patent is extended or adjusted under 35 U.S.C. 154(b) by 184 days.

(21) Appl. No.: 13/330,004

(22) Filed: Dec. 19, 2011

(65) Prior Publication Data

US 2012/0156888 A1 Jun. 21, 2012

(30) Foreign Application Priority Data

Dec. 20, 2010 (JP) .................... 2010-282675

(51) Int. Cl.
*H01L 21/302* (2006.01)
(52) U.S. Cl.
USPC ............ 216/49; 216/58; 216/62; 216/67; 438/705; 438/706; 438/725; 438/942; 438/947
(58) Field of Classification Search
None
See application file for complete search history.

(56) References Cited

U.S. PATENT DOCUMENTS

| | | | | |
|---|---|---|---|---|
| 5,674,409 A | * | 10/1997 | Muller | 216/41 |
| 5,976,769 A | * | 11/1999 | Chapman | 430/316 |
| 6,869,899 B2 | * | 3/2005 | Mahorowala et al. | 438/587 |
| 7,517,796 B2 | * | 4/2009 | Raghuram et al. | 438/666 |
| 2010/0055621 A1 | * | 3/2010 | Hatakeyama et al. | 430/323 |

FOREIGN PATENT DOCUMENTS

| | | |
|---|---|---|
| JP | 2004-080033 | 3/2004 |
| JP | 2010-103497 | 5/2010 |
| JP | 2010-161162 | 7/2010 |

\* cited by examiner

*Primary Examiner* — Anita Alanko
(74) *Attorney, Agent, or Firm* — Cantor Colburn LLP

(57) ABSTRACT

A slimming method includes transferring an object to be processed on which a patterned carbon-containing thin film is formed into a process chamber in an oxidation apparatus; and oxidizing and removing the surface of the carbon-containing thin film by an oxidizing gas while supplying moisture into the process chamber, to reduce widths of the protruded portions on the pattern of the carbon-containing thin film.

7 Claims, 13 Drawing Sheets

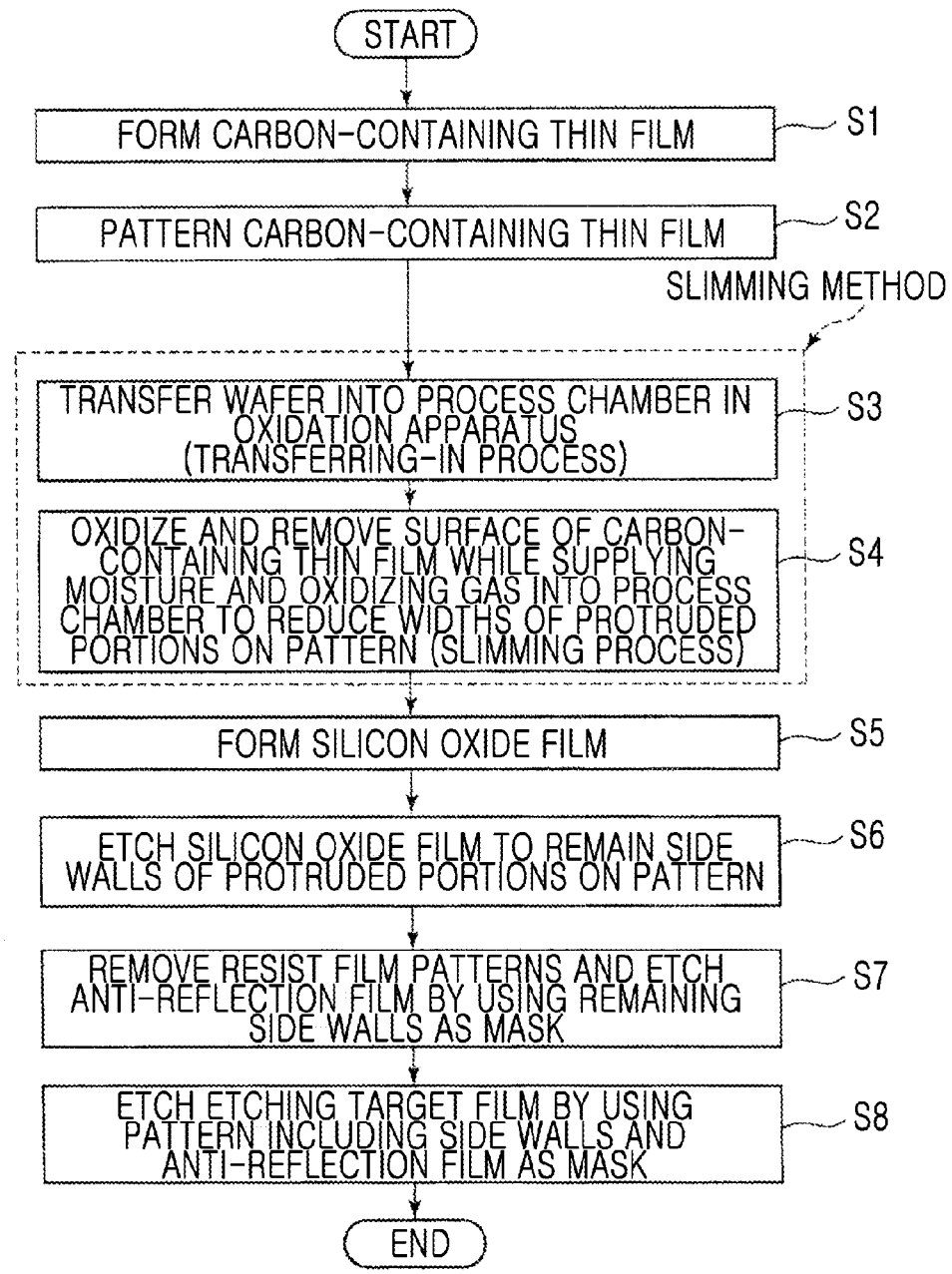

<FIRST VERIFICATION EXPERIMENT>

<FIRST VERIFICATION EXPERIMENT>

<SECOND VERIFICATION EXPERIMENT>

<SECOND VERIFICATION EXPERIMENT>

SLIMMING METHOD OF CARBON-CONTAINING THIN FILM AND OXIDATION APPARATUS

CROSS-REFERENCE TO RELATED PATENT APPLICATIONS

This application claims the benefit of Japanese Patent Application No. 2010-282675, filed on Dec. 20, 2010 in the Japan Patent Office, the disclosure of which is incorporated herein in its entirety by reference.

BACKGROUND OF THE INVENTION

1. Field of the Invention

The present invention relates to a slimming method of a carbon-containing thin film such as a patterned resist film formed on an object to be processed such as a semiconductor wafer, and an oxidation apparatus.

2. Description of the Related Art

In general, various processes such as film-formation, etching, oxidation, diffusion, surface modification, and removing of a natural oxide film are performed on a semiconductor wafer that may be a silicon substrate or the like in order to manufacture a semiconductor integrated circuit. When the above processes are performed in a vertical, so-called a batch type thermal processing apparatus disclosed in Patent Reference 1, semiconductor wafers are transferred from a cassette that may hold a plurality of semiconductor wafers, for example, 25 of semiconductor wafers, to a vertical wafer boat, to be supported by the wafer boat in multiple layers. About 30 to 150 of wafers may be placed on the wafer boat, depending on, for example, a size of the wafer. The wafer boat is transferred (loaded) into a process chamber, which may be evacuated, from a lower portion of the process chamber, and inside the process chamber is sealed hermetically. In addition, a predetermined annealing process is performed while controlling various process conditions such as a flow rate of a process gas, a process pressure, and process temperature.

Here, accompanied with high integration of the semiconductor integrated circuit, line widths or gaps required by manufacturing processes are fine. In general, fine patterns forming the semiconductor integrated circuit are formed by a photolithography technology. For example, patterns of a resist film are formed on the semiconductor wafer by the photolithography technology, and a base film is etched by using the resist patterns as a mask to form fine patterns.

According to the photolithography technology, a liquid immersion exposure method that effectively reduces an exposure wavelength by disposing liquid such as water having a greater refractive index than that of air between a wafer and an exposure device in order to improve a resolution of the exposure device by using ArF laser beam having a short wavelength has been adopted in order to meet the demands for miniaturization. However, the recent demand of miniaturization has exceeded the limitation in resolution according to the photolithography technology.

Therefore, according to the recent demand of further miniaturization, a method of forming fine patterns, which combines a film-forming process for forming a silicon oxide film on a carbon-containing thin film such as a patterned resist film and a side wall transfer (SWT) process or a lithography-lithography etching (LLE) method, has been suggested recently (for example, Patent References 2 and 3).

According to the SWT process, a slimming process in which entire surfaces of protruded portions on the pattern formed of, for example, resist film, are appropriately oxidized to be removed, is performed in order to reduce widths of the protruded portions substantially. In addition, a silicon oxide film is formed on the resist pattern, and the silicon oxide film is appropriately etched-back such that side walls formed on side surfaces of the protruded portions remain. Then, the exposed resist pattern is removed so as to etch a base layer that is an etch target layer by using the remaining side walls as a mask, and thus, fine patterns that may overcome the limitation in resolution according to the photolithography technology may be obtained.

However, according to the slimming process that oxidizes and removes the surfaces of the protruded portions on the carbon-containing thin film such as the patterned resist film as described above, a plurality of objects to be processed are held in a batch type process chamber that is elongated in a longitudinal direction, and an oxidizing gas, for example, oxygen, flows into the process chamber to generate plasma in an oxygen atmosphere so that the surface of the carbon-containing thin film is appropriately oxidized by active oxygen species to trim the surface of the carbon-containing thin film.

However, in the above described slimming process, the slimming process depends on the number of wafers held in the process chamber at a time, or has an insufficient reproducibility due to an unevenness of a slimming amount (trimming amount) in each of the slimming processes.

Prior Art Reference (Patent Reference 1) Japanese Patent Laid-open Publication No. 2010-161162

(Patent Reference 2) Japanese Patent Laid-open Publication No. 2004-080033

(Patent Reference 3) Japanese Patent Laid-open Publication No. 2010-103497

SUMMARY OF THE INVENTION

To address the above problems, the present invention provides a slimming method of a carbon-containing thin film and an oxidation apparatus capable of improving reproducibility in each of slimming processes by preventing unevenness of slimming amounts (trimming amounts) in the slimming processes of protruded portions on the carbon-containing thin film patterns such as resist from generating.

The present inventors have conducted researches on the slimming process, and found that a cause generating unevenness of slimming amounts during the slimming process of the carbon-containing thin film such as the resist film was dependent upon moisture contained in the wafers or generated as a byproduct during the slimming process. Also, to suppress an effect of moisture as described above, the inventors had resulted in that the unevenness of the slimming amounts may be prevented by supplying an excessive amount of moisture more than an amount of moisture as described above, intentionally.

According to claim 1 of the present invention, there is provided a slimming method of a carbon-containing thin film, the slimming method including: transferring an object to be processed on which a patterned carbon-containing thin film is formed into a process chamber in an oxidation apparatus; and oxidizing and removing a surface of the carbon-containing thin film by an oxidizing gas while supplying moisture into the process chamber, to reduce widths of protruded portions on the pattern of the carbon-containing thin film.

As described above, the surface of the carbon-containing thin films is oxidized and removed while supplying moisture into the process chamber, and thus, the widths of the protruded portions on the pattern are reduced. Therefore, the unevenness of the slimming amounts (trimming amounts) in each of the slimming processes may be suppressed regardless of the number of the objects to be processed that are processed at a time, and thus, the reproducibility may be improved.

According to claim 2 of the present invention, there is provided a slimming method of a carbon-containing thin film, the slimming method including: transferring an object to be processed on which a patterned carbon-containing thin film is formed into a process chamber in an oxidation apparatus; supplying moisture into the process chamber; and oxidizing and removing a surface of the carbon-containing thin film by an oxidizing gas, to reduce widths of protruded portions on the pattern of the carbon-containing thin film.

As described above, the moisture is supplied into the process chamber right before the slimming process, and thus, the unevenness of the slimming amounts (trimming amounts) in each of the slimming processes may be suppressed regardless of the number of the objects to be processed that are processed at a time, and thus, the reproducibility may be improved.

According to claim 3 of the present invention, there is provided a slimming method of a carbon-containing thin film, the slimming method including: transferring an object to be processed on which a patterned carbon-containing thin film is formed into a process chamber in an oxidation apparatus; supplying moisture into the process chamber; and oxidizing and removing a surface of the carbon-containing thin film by an oxidizing gas while supplying moisture into the process chamber, to reduce widths of protruded portions on the pattern of the carbon-containing thin film.

As described above, the moisture is supplied into the process chamber right before the slimming process, and additionally, the surface of the carbon-containing thin film is oxidized and removed while supplying the moisture into the process chamber, to reduce the widths of the protruded portions on the pattern. Therefore, the unevenness of the slimming amounts (trimming amounts) in each of the slimming processes may be suppressed regardless of the number of the objects to be processed that are processed at a time, and thus, the reproducibility may be improved.

According to claim 8 of the present invention, there is provided an oxidation apparatus including: a process chamber in which a vacuum suction may be performed; a holding unit for holding a plurality of objects to be processed, on which patterned carbon-containing thin films are formed, in the process chamber; an oxidizing gas supply unit for supplying an oxidizing gas into the process chamber; a moisture supply unit for supplying moisture into the process chamber; an activation unit for activating the oxidizing gas; and an apparatus controller for controlling the entire apparatus in order to execute the slimming method of the carbon-containing thin film according to any of claims 1 through 6.

According to claim 9 of the present invention, there is provided an oxidation apparatus including: a process chamber in which a vacuum suction may be performed; a holding unit for holding a plurality of objects to be processed, on which patterned carbon-containing thin films are formed, in the process chamber; an oxidizing gas supply unit for supplying an oxidizing gas into the process chamber; a moisture supply unit for supplying moisture into the process chamber; a heating unit for heating the objects to be processed; and an apparatus controller for controlling the entire apparatus in order to execute the slimming method of the carbon-containing thin film according to any of claims 1 through 5, and 7.

Additional objects and advantages of the invention will be set forth in the description which follows, and in part will be obvious from the description, or may be learned by practice of the invention.

The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 4 is a flowchart showing a method of forming fine patterns including a slimming method, according to an embodiment of the present invention;

DETAILED DESCRIPTION OF THE INVENTION

Figure 1:
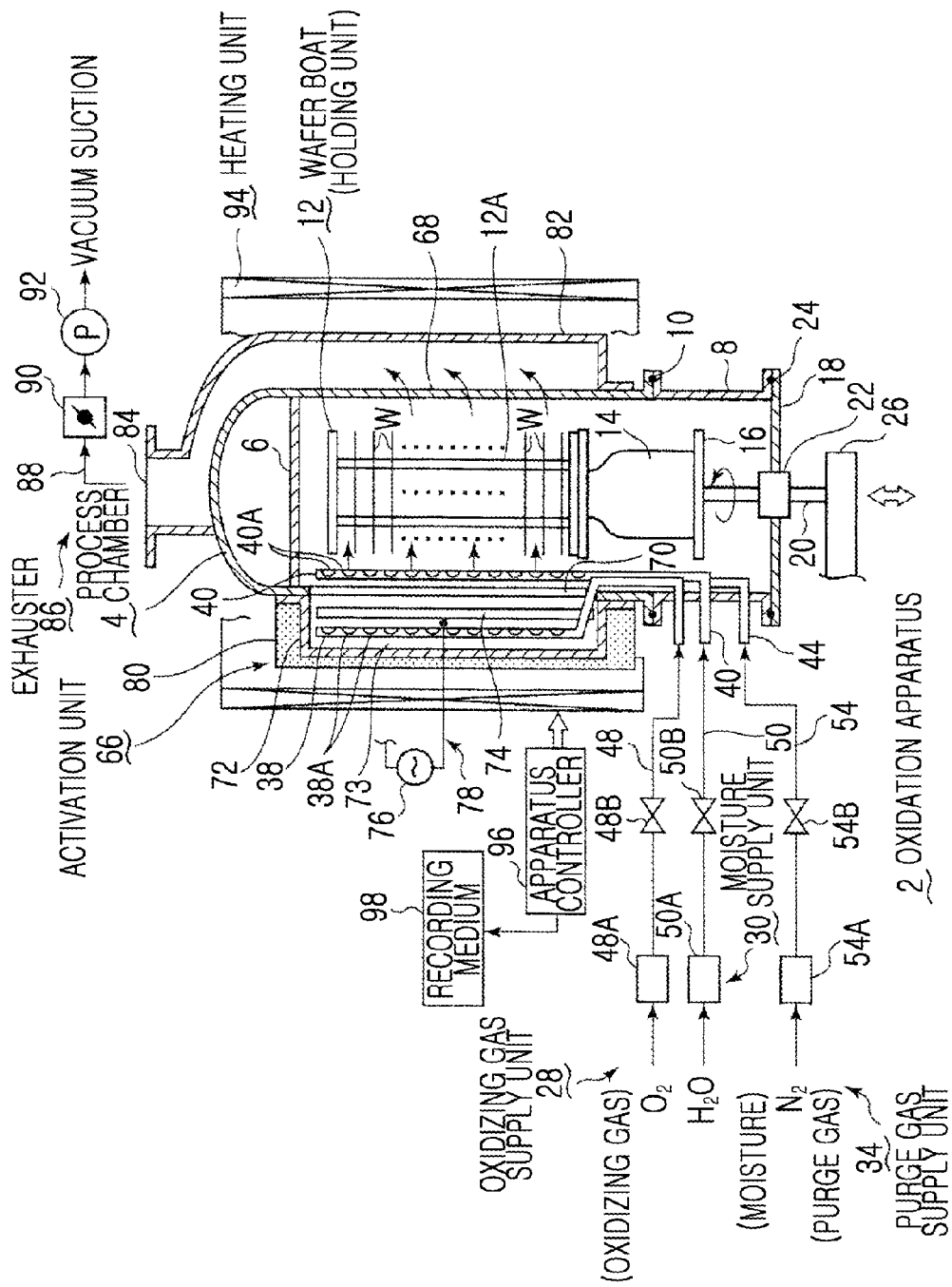
FIG. 1 is a longitudinal-sectional view of an oxidation apparatus according to an embodiment of the present invention.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Hereinafter, a slimming method of a carbon-containing thin film and an oxidation apparatus according to embodiments of the present invention will be described with reference to accompanying drawings.

Figure 2:
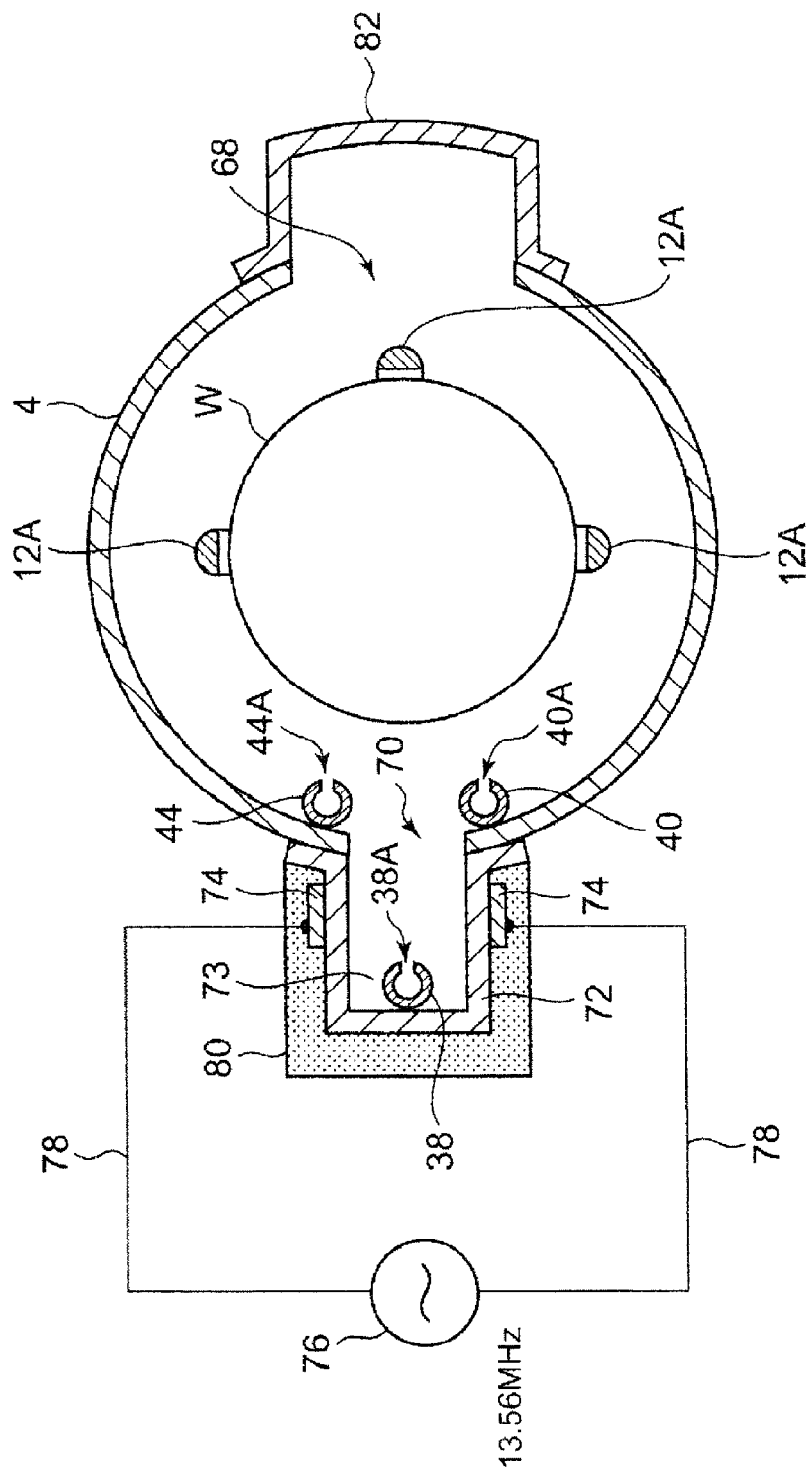
FIG. 2 is a cross-sectional view of an oxidation apparatus (omitting a heating unit)

FIG. 1 is a longitudinal-sectional view of an oxidation apparatus according to an embodiment of the present invention. FIG. 2 is a cross-sectional view of an oxidation apparatus (omitting a heating unit). Herein, oxygen is used as an oxidizing gas.

As shown in the drawings, the oxidation apparatus 2 that may generate plasma includes a process chamber 4 that is formed as a cylinder having an opened lower end and a ceiling. Entire portion of the process chamber 4 may be formed of, for example, quartz. A ceiling plate 6 formed of quartz is provided and sealed on the ceiling of the process chamber 4. In addition, a manifold 8 that is a cylinder formed of, for example, stainless steel, is connected to an opening of a lower end of the process chamber 4 via a sealing member 10 such as an O-ring. Otherwise, the process chamber may be formed as a cylinder that is entirely formed of quartz without providing the manifold 8 formed of the stainless steel.

The lower end of the process chamber 4 is supported by the manifold 8, and a wafer boat 12 that is formed of quartz as a holding unit, on which a plurality of objects to be processed, that is, semiconductor wafers W (hereinafter, also referred to as wafers W), are placed in multiple layers, is freely elevated from a lower portion of the manifold 8 to be inserted into or pulled out from the process chamber 4. In the present embodiment, in a pillar 12A of the wafer boat 12, for example, about 50 to 150 of wafers W each having a diameter of 300 mm are supported in multiple layers with nearly regular pitches.

The wafer boat 12 is placed on a table 16 via a quartz thermos vessel 14, and the table 16 is supported on an upper end of a rotation shaft 20 that penetrates through a cover unit 18 that is formed of, for example, stainless steel, for opening/closing a bottom opening of the manifold 8. In addition, a magnetic fluid seal 22, for example, is provided on a portion of the rotation shaft 20 penetrating the cover unit 18 so as to tightly seal the rotation shaft 20 and to rotatably support the rotation shaft 20. In addition, a sealing member 24, e.g., an O-ring, is provided between the peripheral portion of the cover unit 18 and the bottom of the manifold 8 so as to hold the sealing of the process chamber 4.

The rotation shaft 20 is attached to a leading end of an arm 26 that is supported by an elevating mechanism (not shown), for example, a boat elevator, and elevates the wafer boat 12, the cover unit 18, and the like integrally so that the wafer boat 12 and the cover unit 18 may be inserted to and pulled out from the process chamber 4. In addition, the table 16 is fixedly provided toward the cover unit 18, and the wafers W may be processed without rotating the wafer boat 12.

An oxidizing gas supply unit 28 supplying an oxidizing gas, for example, oxygen, into the process chamber 4, a moisture supply unit 30 supplying moisture into the process chamber 4, and a purge gas supply unit 34 supplying an inert gas as a purge gas, for example, nitrogen ($N_2$) gas, into the process chamber 4 are provided on the manifold 8.

In detail, the oxidizing gas supply unit 28 includes a gas nozzle 38, for example, a quartz pipe, inwardly passing through a side wall of the manifold 8, being bent upward, and vertically extending. A plurality of gas ejection holes 38A are provided on the gas nozzle 38 along a lengthwise direction of the gas nozzle 38 with predetermined intervals, and thus, oxygen ($O_2$) may be ejected substantially uniformly from each of the gas ejection holes 38A in a horizontal direction. Such a gas nozzle is referred to as an ejection type gas nozzle.

Likewise, the moisture supply unit 30 includes a gas nozzle 40, for example, a quartz pipe, inwardly passing through a side wall of the manifold 8, being bent upward, and vertically extending. A plurality of gas ejection holes 40A are provided on the gas nozzle 40 along a lengthwise direction of the gas nozzle 40 with predetermined intervals so that moisture, that is, vapor, may be ejected substantially and uniformly from each of the gas ejection holes 40A in a horizontal direction. In addition, the moisture is actually supplied as a gas including moisture with a carrier gas such as $N_2$ or $O_2$.

Likewise, the purge gas supply unit 34 also includes a gas nozzle 44, for example, a quartz pipe, inwardly passing through a side wall of the manifold 8, being bent upward, and vertically extending. A plurality of gas ejection holes 44A (refer to FIG. 2) are provided on the gas nozzle 44 along a lengthwise direction of the gas nozzle 44 with predetermined intervals, like the gas nozzle 40 described above, and thus, $N_2$ gas may be ejected substantially uniformly from each of the gas ejection holes 44A in a horizontal direction.

Gas passages 48, 50, and 54 are connected respectively to the gas nozzles 38, 40, and 44. In addition, flow rate controllers 48A, 50A, and 54A such as mass-flow controllers and opening/closing valves 48B, 50B, and 54B are provided respectively on the gas passages 48, 50, and 54, so that the oxygen, the vapor, and the $N_2$ gas may be supplied while controlling flow rates thereof. A vapor generator (not shown) is connected to an upper stream side of the gas passage 50 of the moisture supply unit 30. In addition, although the moisture supply unit 30 is separately provided in the present embodiment, the moisture supply unit 30 may be combined with the oxidizing gas supply unit 28 or the purge gas supply unit 34 so that the moisture (vapor) may be ejected from the gas nozzles 38 or the gas nozzles 44.

On the other hand, an activation unit 66 that activates the oxygen by generating plasma along a heightwise direction thereof is provided on a portion of the side wall of the process chamber 4. In addition, an exhaust port 68 is longitudinally and narrowly provided by vertically cutting off a side wall of the process chamber 4 on an opposite side in the process chamber 4 corresponding to the activation unit 66 so as to perform a vacuum suction of an atmosphere inside the process chamber 4. In detail, the activation unit 66 is provided by cutting off the side wall of the process chamber 4 to be a predetermined width along a longitudinal direction to provide a thin and long opening 70, and by welding a plasma partition wall 72, which is formed of quartz to be thin and long in the longitudinal direction and has a recess cross-section, hermetically onto a side wall of the process chamber 4 so as to cover the opening 70 from outside.

Accordingly, a portion of the side wall of the process chamber 4 is recessd to outside so that a plasma chamber 73, a side of which is communicated with an inside of the process chamber 4 to be connected to the process chamber 4, is provided. That is, a space inside the plasma partition wall 72 is integrally communicated with the inside of the process chamber 4. The opening 70 is provided to be long enough in the longitudinal direction to cover all of the wafers W placed by the wafer boat 12 in the heightwise direction. In addition, a slit plate including a plurality of slits may be provided on the opening 70.

A pair of plasma electrodes 74 that are thin and long are provided on outer surfaces of both side walls of the plasma partition wall 72 to face each other along a lengthwise direction (longitudinal direction) of the plasma partition wall 72. In addition, a high frequency (RF) power source 76 is connected to the plasma electrodes 74 via a power feeding line 78, and applies a RF voltage of about 13.56 MHz to the plasma electrodes 74 so as to generate plasma. In addition, a frequency of the RF voltage is not limited to 13.56 MHz, that is, different frequency, for example, 400 kHz may be applied to the plasma electrodes 74.

In addition, the gas nozzle 38 extending upward in the process chamber 4 for supplying the oxidizing gas is bent at an intermediate portion toward an outer circumferential side in a radial direction of the process chamber 4. Thus, the gas nozzle 38 is located at an innermost portion of the plasma chamber 73 (at a portion that is the farthest from a center of the process chamber 4), and erected up toward an upper portion of the plasma chamber 73 along the innermost portion of the plasma chamber 73. Therefore, when the RF power source 76 is turned on, the oxygen gas ejected from the gas ejection holes 38A of the gas nozzle 38 is activated in the plasma chamber 73 and flows toward the center of the process chamber 4 while being diffused.

In addition, an insulation protection cover 80 formed of, for example, quartz, is attached to an outer wall of the plasma partition wall 72 so as to cover the plasma partition wall 72. Also, a refrigerant path (not shown) is provided on an inner side of the insulation protection cover 80, and thus, the $N_2$ gas that is cooled down or cooling water is flowed through the refrigerant path so as to cool down the plasma electrodes 74.

In addition, the gas nozzle 40 for supplying the moisture and the gas nozzle 44 for supplying the purge gas are provided in erected states on an outer periphery of the opening 70 of the plasma chamber 73, that is, outside the opening 70 (in the process chamber 4) so as to eject the vapor and the $N_2$ gas that is the purge gas respectively from the gas ejection holes 40A and 44A provided on the gas nozzles 40 and 44 toward the center of the process chamber 4.

On the other hand, an exhaust port cover member 82 that is formed of quartz having a cross-section formed as U shape to cover the exhaust port 68 is welded onto the exhaust port 68 that faces the opening 70. The exhaust port cover member 82 extends upward along a side wall of the process chamber 4, and is communicated with a gas outlet 84 provided on an upper portion of the process chamber 4. In addition, an exhaust system 86 is connected to the gas outlet 84. The exhaust system 86 includes an exhaust path 88 that is connected to the gas outlet 84, and a pressure adjusting valve 90 and a vacuum pump 92, which adjust a pressure inside the process chamber 4, are sequentially provided on the exhaust path 88 so as to perform a vacuum suction while maintaining an inner pressure of the process chamber 4 at a predetermined level. In addition, a heating unit 94 of a cylindrical shape surrounds an outer circumference of the process chamber 4 to heat the process chamber 4 and the wafers W in the process chamber 4. Otherwise, the heating unit 94 may not be provided.

In addition, overall processes of the oxidation apparatus 2 having the above structures, for example, process pressure, process temperature, supply of each of the gases (including vapor) by opening/closing the opening/closing valves, suspension of the gas supply, control of the gas flow rate, and control of turning on/off of the RF voltage, are performed by an apparatus controller 96 that is a computer, for example. Also, the apparatus controller 96 includes a recording medium 98 in which a program for executing the above controlling process is stored. The recording medium 98 may be, for example, a flexible disc, a compact disc (CD), a CD-ROM, a hard disc, a flash memory, or a DVD. In addition, the apparatus controller 96 is connected to a user interface that is not shown so as to transmit various data including recipes.

Next, a slimming method performed by using the oxidation apparatus 2 according to the present invention will be described with reference to FIGS. 3A through 3H, and 4. FIGS. 3A through 3H are schematic cross-sectional views of a semiconductor wafer for illustrating a method of forming fine patterns including the slimming method according to an embodiment of the present invention, and FIG. 4 is a flowchart showing the method of forming the fine patterns including the slimming method. First, processes of the oxidation apparatus 2 performing the slimming method according to the present embodiment will be described as follows.

Primarily, the wafer boat 12 on which a plurality of, for example, 50 to 150 of wafers W each having a diameter of 300 mm are placed under a room temperature is transferred into the process chamber 4, which is heated to a predetermined temperature, while being elevated from a lower portion of the process chamber 4. Then, the cover unit 18 closes the opening of the lower end portion of the manifold 8 to seal the process chamber 4. A resist film, that is, a carbon-containing thin film, is patterned to have a recessed and protruded shape on a surface of each of the wafers W, as will be described later.

In addition, vacuum suction inside the process chamber 4 is performed to maintain the pressure inside the process chamber 4 at a predetermined process pressure, and at the same time, an electric power supplied to the heating unit 94 is increased to raise temperatures of the wafers W and to maintain process temperature. If oxygen is sufficiently activated by the plasma, the heating unit 94 may not be driven. For example, when the moisture and the wafer are activated by the heating unit 94 in a case where the plasma is used, the temperature rises to about 850° C. according to a used material, for example, a thermal chemical vapor deposition (CVD) carbon film. Therefore, the temperature of the heater is set to be about a room temperature, that is, 25° C. to 850° C., in the oxidation apparatus having the heating unit 94. In addition, the oxygen gas is supplied into the process chamber 4 from the oxidizing gas supply unit 28, and the vapor, that is, moisture, is supplied into the process chamber 4 from the moisture supply unit 30. In more detail, the oxygen gas, the flow rate of which is controlled, is ejected from each of the gas ejection holes 38A of the gas nozzle 38 for supplying the oxidizing gas in the horizontal direction, and is supplied into the process chamber 4 through the plasma chamber 73. In addition, the vapor, the flow rate of which is controlled, is ejected from each of the gas ejection holes 40A of the gas nozzle 40 for supplying the moisture in the horizontal direction and supplied into the process chamber 4.

At the same time of supplying the gases, the RF voltage is applied to the pair of plasma electrodes 74 of the activation unit 66 from the RF power source 76, and accordingly, the plasma is generated in the plasma chamber 73 so that the oxygen gas supplied in the plasma chamber 73 is activated by the plasma. A surface of the carbon-containing thin film, for example, the resist film, formed on the surface of the wafer W is oxidized by active species of the oxygen gas to be removed, and then, the slimming process, that is, reducing of widths of protruded portions on the pattern of the resist film, is performed, as will be described later.

Here, since the moisture contained in the wafers W themselves may be supplied to the process chamber 4 or the moisture as a byproduct of the oxidation reaction may be generated in the process chamber 4, apprehension such as unevenness of the slimming amounts may occur due to an adverse effect by the moisture. However, according to the present embodiment, as described above, the vapor having a greater amount of moisture than the above moisture amount is supplied simultaneously with the oxidation reaction, and thus, the amount of moisture contained in the process chamber 4 due to the wafers W or the amount of moisture generated as the byproduct of the reaction is diluted by the vapor as described later, and the adverse effect by the moisture is reduced to an ignorable level. Accordingly, generation of the unevenness of the slimming amounts in each of runs (each slimming process) may be prevented.

In addition, when the oxidation process is started as described above, the exhaust system 86 is driven and the vacuum pump 92 is rotated continuously to perform the vacuum suction inside the process chamber 4, and thus, various gases generated due to the oxidation reaction in the process chamber 4 are exhausted through the exhaust port 68 as exhaust gases, and then, are flowed along the exhaust path 88 through the gas outlet 84.

Figure 3A:
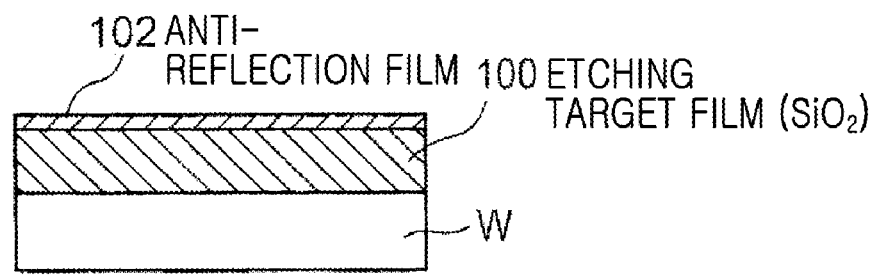
FIGS. 3A through 3H are schematic cross-sectional views of a semiconductor wafer for showing a method of forming fine patterns, which includes a slimming method according to an embodiment of the present invention.

Next, the method of forming the fine patterns including the slimming method of the carbon-containing thin film as described above will be described with reference to FIGS. 3A through 3H, and 4. As shown in FIG. 3A, an etching target film 100 that is finally patterned by being etched and an anti-reflection film 102 are sequentially formed on an upper surface of a semiconductor wafer W, that is, an object to be processed. The anti-reflection film 102 functions as an anti-reflection film (BARC) when a photolithography process is applied to a resist film formed thereon, and may function as a mask when the etching target film 100 of a base is etched.

The wafer W may be a silicon substrate, for example, and various semiconductor devices and circuit patterns are formed on the upper surface of the wafer W, if necessary. The etching target film 100 may be, for example, a film including silicon nitride, silicon oxide, silicon oxynitride, amorphous silicon, or polysilicon, and the present invention is not limited thereto. In addition, the etching target film 100 may be formed to a thickness of about, for example, 20 nm to 200 nm.

In addition, the anti-reflection film 102 may be formed of an organic material such as amorphous carbon, polyphenol, or photoresist, and the present embodiment is not limited thereto. A refractive index of the anti-reflection film 102 to a laser beam during an exposure according to the photolithography technology is adjusted.

Figure 3B:
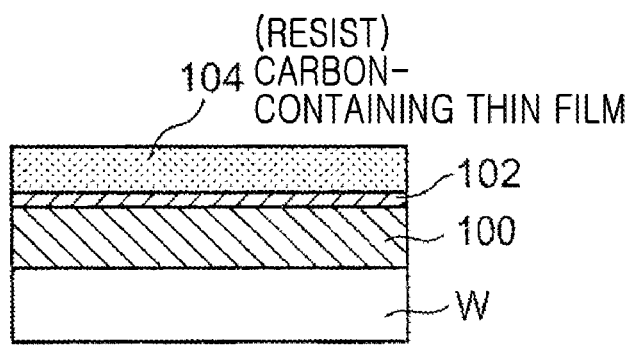

Meanwhile, as shown in FIG. 3B, a carbon-containing thin film 104 is formed on the surface of the semiconductor wafer W, that is, on the anti-reflection film 102, formed as described above (process S1). A thickness of the carbon-containing thin film 104 ranges from 50 nm to 200 nm, for example. The carbon-containing thin film 104 may be formed of an organic material such as a resist film including carbon and hydrogen, and is exposed to ArF laser beam, for example. If the carbon-containing thin film 104 is, for example, the resist film, the resist film may be formed by using a spinning application device.

Figure 3C:
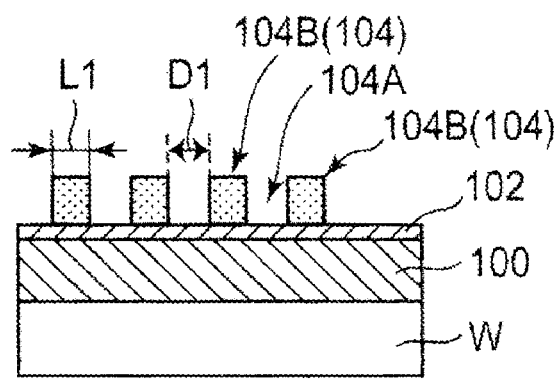

Next, the carbon-containing thin film 104 is exposed and developed to the ArF laser beam according to the photolithography process by using a mask (not shown) and a liquid immersion method, and then, the carbon-containing thin film 104 is patterned as shown in FIG. 3C (process S2). Due to the above patterning, recessed portions 104A that reaches the base layer and protruded portions 104B are patterned to have a recessed and protruded shape on the carbon-containing thin film 104. A width D1 of the recessed portion 104A is about 40 nm, and a width (thickness) L1 of the protruded portion 104B is about 40 nm. Here, the anti-reflection film 102 is exposed on bottom surfaces of the recessed portions 104A.

Figure 3D:
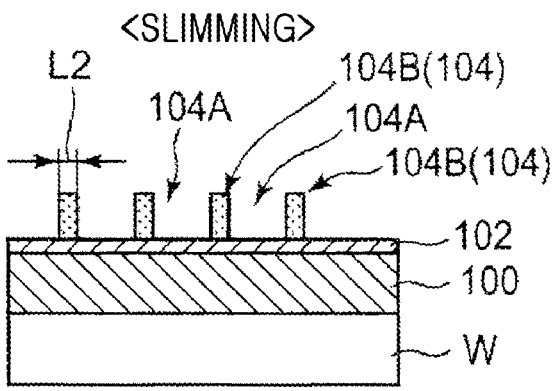

As described above, when the carbon-containing thin film 104 is patterned, the wafer W is transferred into the process chamber 4 of the oxidation apparatus 2 described with reference to FIGS. 1 and 2 (process S3). In this case, as described above, the plurality of wafers W are held in the process chamber 4 in a state where the wafers W are supported by the wafer boat 12 in multiple layers. In addition, in the oxidation apparatus 2, the oxidizing gas, for example, oxygen gas, is flowed into the process chamber 4, and at the same time, the oxygen gas is activated by the plasma that is generated by the RF electric power, as described above. Additionally, a large amount of vapor is supplied into the process chamber 4, and thus, as shown in FIG. 3D, the patterned surface of the carbon-containing thin film 104 is oxidized and removed so that the widths L1 of the protruded portions 104B may be reduced (process S4). The above described process is referred to as a slimming process.

A reaction formula in the above oxidization is represented as follows.

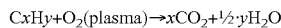

$$CxHy + O_2(plasma) \rightarrow xCO_2 + \tfrac{1}{2}yH_2O$$

Here, CxHy represents the resist film (organic material), and x and y are any positive integers, respectively. The amount of moisture supplied by the moisture supply unit 30 may vary depending on the number of wafers W to be processed, for example, about 5 sccm to about 50 sccm in a case where 100 of wafers W each having a diameter of 300 mm are held in the process chamber 4. In other words, an amount of the moisture supplied per a wafer W is about 0.05 sccm to about 0.5 sccm. The flow rate of oxygen may be, for example, about 100 sccm to about 10000 sccm, and the slimming time may vary depending on the thickness to be trimmed, for example, about 30 minutes.

Since surfaces of the protruded portions 104B of the carbon-containing thin film 104 are oxidized and trimmed by the slimming process, the protruded portions 104B may be thinner so that the widths (thickness) of the protruded portions 104B are L2 (L2<L1). In more detail, the width L1, for example, 40 nm, is reduced to the width L2, for example, 10 nm. In addition, a height of the protruded portion 104B is also reduced a little, which is not described here.

Here, as described above, since the moisture contained in the wafers W is supplied to the process chamber 4 or the moisture is generated as the byproduct of the oxidation reaction, apprehension such as unevenness of the slimming amounts may occur due to the adverse effect by the moisture. However, according to the present embodiment, as described above, the vapor having a greater amount of moisture than the above moisture amount is supplied simultaneously with the oxidation process, and thus, the amount of moisture contained in the process chamber 4 due to the wafers W and the amount of moisture generated as the byproduct of the reaction is diluted by the vapor and the adverse effect by the moisture is reduced to an ignorable level. Therefore, generation of the unevenness of the slimming amounts in each run (each slimming process) may be prevented.

That is, since the amount of the moisture that is contained in the wafer W and the moisture generated as the byproduct of the reaction is much less than the amount of moisture that is intentionally supplied in the present embodiment, even when the amount of the moisture contained in the wafer W and the amount of moisture generated as the byproduct of the reaction is changed, the change may be suppressed. Accordingly, the unevenness of the slimming amounts (trimming amounts) in each of the slimming processes may be suppressed, and widths (thickness) of the protruded portions 104B may be uniform. In this case, the width D1 of the recessed portion 104A, which is a distance between two neighboring protruded portions 104B, is increased as much as the slimming amount from the side walls of the protruded portions 104B.

Figure 3E:
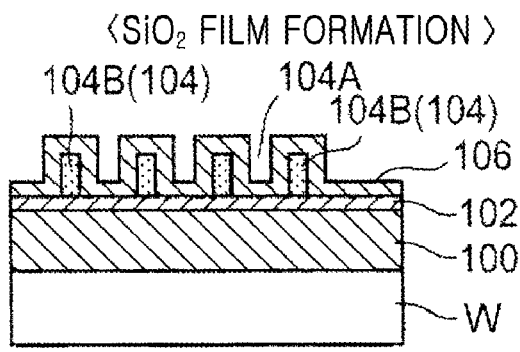

The wafer W on which the slimming process is performed as described above is transferred from the process chamber 4, and is transferred into another film-forming apparatus. In addition, as shown in FIG. 3E, a thin film, for example, a silicon oxide film 106, is formed on the carbon-containing thin film 104 that has been slimming processed and has a recessed and protruded shape and on the anti-reflection film 102 in the film-forming apparatus (process S5). The silicon oxide film 106 may be formed on upper and side surfaces of the protruded portions 104B (side surfaces of the recessed portions 104A), and on bottom surfaces of the recessed portions 104A of the carbon-containing thin film 104 to a predetermined thickness. The present embodiment is not limited to the silicon oxide film 106, for example, a SiON film, a SiN film, an amorphous Si film, and a poly Si film may be used as the thin film. In addition, the silicon oxide film 106 may be sequentially formed on the wafer W in the process chamber 4 in which the slimming process is performed without transferring the wafer W from the process chamber 4.

Figure 3F:
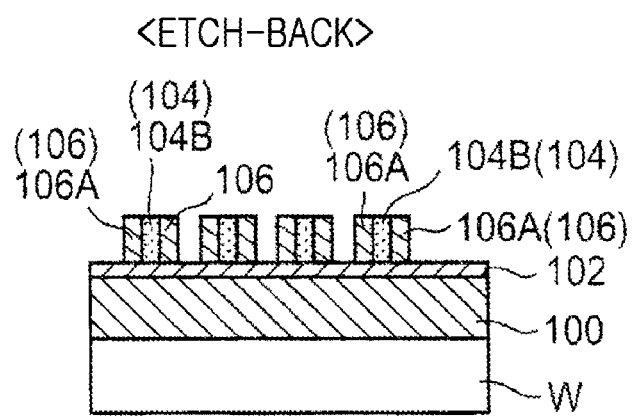

Next, an etching process (etch-back process) of the wafer W on which the silicon oxide film 106 is formed is performed, and thus, the silicon oxide film 106 formed on the upper surfaces of the protruded portions 104B and the bottom surfaces of the recessed portions 104A on the pattern of the carbon-containing thin film 104 is removed as shown in FIG. 3F, and thereby the silicon oxide film formed on the side surfaces of the protruded portions 104B on the pattern, that is, side walls 106A remains (process S6).

Figure 3G:
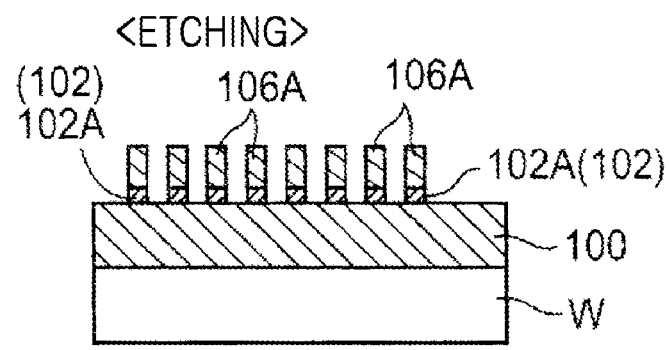

Next, an ashing process to the protruded portions 104B of the carbon-containing thin film 104 that is formed of the resist film, the surface of which is exposed by the etch-back process, is performed to remove the protruded portions 104B, and thus the side walls 106A remains. Then, an etching process is performed using the remaining side walls 106A as a mask, and thus, the anti-reflection film 102 is patterned as shown in FIG. 3G (process S7).

Figure 3H:
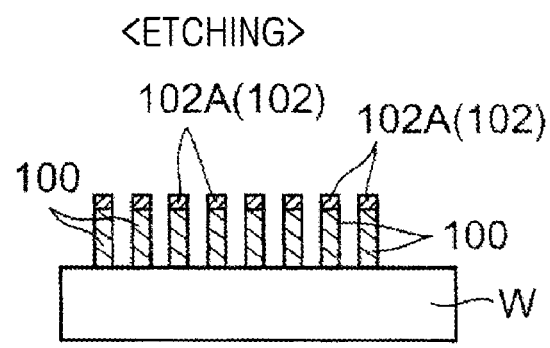

Next, an etching process is performed by using the pattern including the side walls 106A and the patterned anti-reflection film 102A as a mask, and thus, the etching target film 100 is etched to obtain a pattern having desired pitches as shown in FIG. 3H (process S8). The pitches between the recessed portions and protruded portions on the pattern of the etching target film 100 shown in FIG. 3G, which is obtained through the above described processes, are much less than the pitches between the recessed portions 104A and the protruded portions 104B in the pattern of the carbon-containing thin film 104 shown in FIG. 3C.

As described above, according to the present embodiment, the surface of the carbon-containing thin film is oxidized to be removed by the oxidizing gas while supplying the moisture into the process chamber in order to reduce the widths of the protruded portions on the pattern, and thus, unevenness of the slimming amounts (trimming amounts) in each of the slimming processes may be suppressed and the reproducibility may be improved regardless of the number of objects to be processed that are processed at a time.

In the previous embodiment, the organic material such as the resist film is used as the etching target film 100 that is slimming processed and the carbon-containing thin film 104 that is the material for forming the pattern as an example; however, the present invention is not limited thereto. That is, an organic material or a carbon film functioning as the anti-reflection film (BARC) may be used. The carbon film may be formed in any kind of film-forming processes such as a coating process performed by an application device, or a plasma chemical vapor deposition (CVD) or a thermal CVD method. In addition, in forming the pattern on the carbon film, since the pattern is formed on the carbon film by an etching process using a pattern formed on an upper portion of the carbon film in advance as a mask, not by the photolithography, an anti-reflection film may not be necessary under the carbon film.

<First Modified Embodiment>

Figure 5:
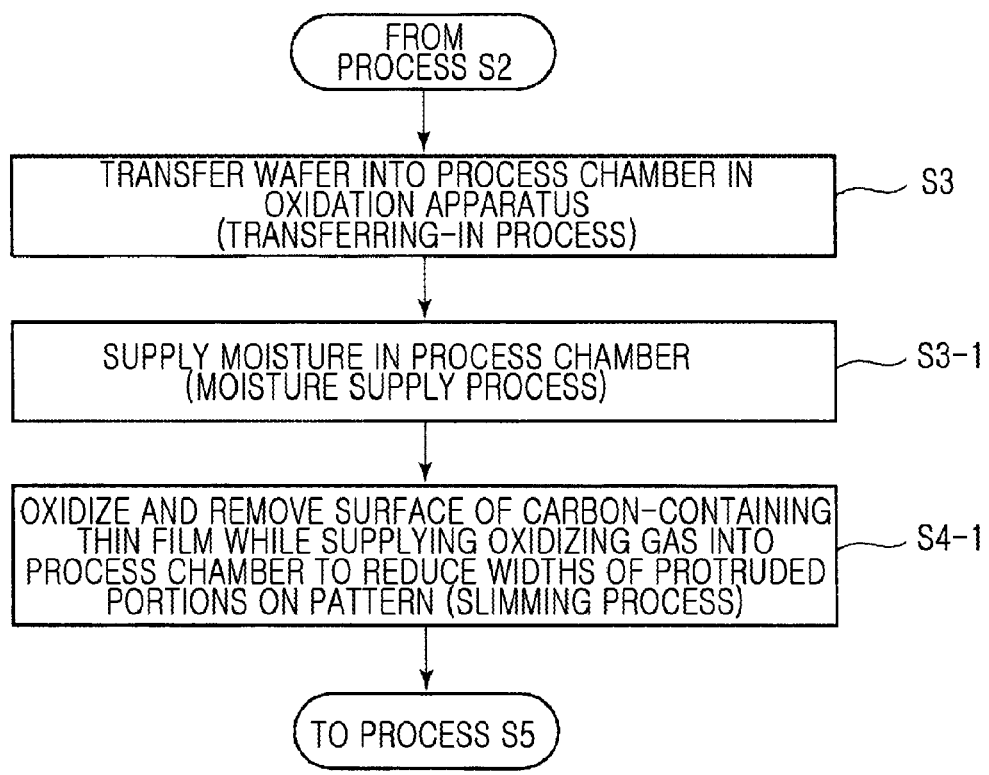
FIG. 5 is a flowchart showing partial processes in the method of forming the fine patterns including the slimming method according to a modified example of the present invention.

Next, a first modified embodiment will be described as follows. In the above embodiment described with reference to FIG. 4, the moisture is supplied into the process chamber 4 when the slimming process is performed; however, the moisture may be supplied into the process chamber 4 right before the slimming process. FIG. 5 is a flowchart showing some processes included in the method of forming fine patterns including a slimming method according to a first modified embodiment of the present invention. The flowchart of FIG. 5 represents some modified processes of the flowchart shown in FIG. 4, and omits other processes except for the principle processes.

According to the first modified embodiment, a plurality of wafers W on which the patterned carbon-containing thin films 104 shown in FIG. 3C are formed are placed on the wafer boat 12, and the wafer boat 12 is transferred (loaded) into the process chamber 4 of the oxidation apparatus and the process chamber 4 is sealed (process S3). Next, moisture is supplied into the process chamber 4 (process S3-1). In the moisture supply process, the vapor as the moisture is supplied into the process chamber 4 while controlling the flow rate of the vapor and the vacuum suction is performed like in the slimming process of the process S4. Accordingly, a large amount of moisture is adsorbed on surfaces of the structures in the process chamber 4 such as wall surfaces in the process chamber 4 and surfaces of the wafer boat 12, and on the surfaces of the wafers W.

In the above state, the oxidizing gas is flowed into the process chamber 4 and the plasma is generated to perform the slimming process (process S4-1). Accordingly, the surface of the carbon-containing thin film 104 is oxidized and removed, and widths (thicknesses) of the protruded portions 104B on the pattern are reduced. Here, since the moisture has been supplied into the process chamber 4 in the above moisture supply process, there is no need to supply the moisture additionally.

As described above, when the slimming process (process S4-1) in which the moisture is not supplied is finished, each of the processes after process S5 is sequentially performed as shown in FIG. 4. In this case, the same operational effects as those of the previous embodiment may be obtained. In addition, in the first modified embodiment, the moisture may be also supplied into the process chamber 4 in the slimming process S4-1. In this case, the slimming process S4-1 is the same as the slimming process S4 shown in FIG. 4.

<Verification of Effect by Moisture>

In the present invention, countermeasures against the moisture that may cause the unevenness of the slimming amounts (trimming amounts) in each of the slimming processes of the carbon-containing thin film formed of the resist film are researched; however, verification experiments for verifying whether the moisture actually causes the unevenness of the slimming amounts were performed. First through third verification experiments will be described as follows.

Figure 6A:
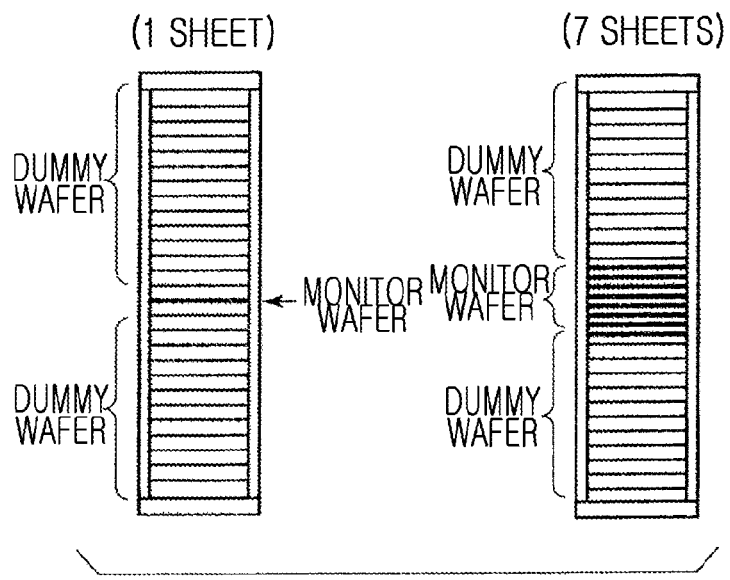
FIGS. 6A and 6B are diagrams for describing a first verification experiment.
Figure 6B:
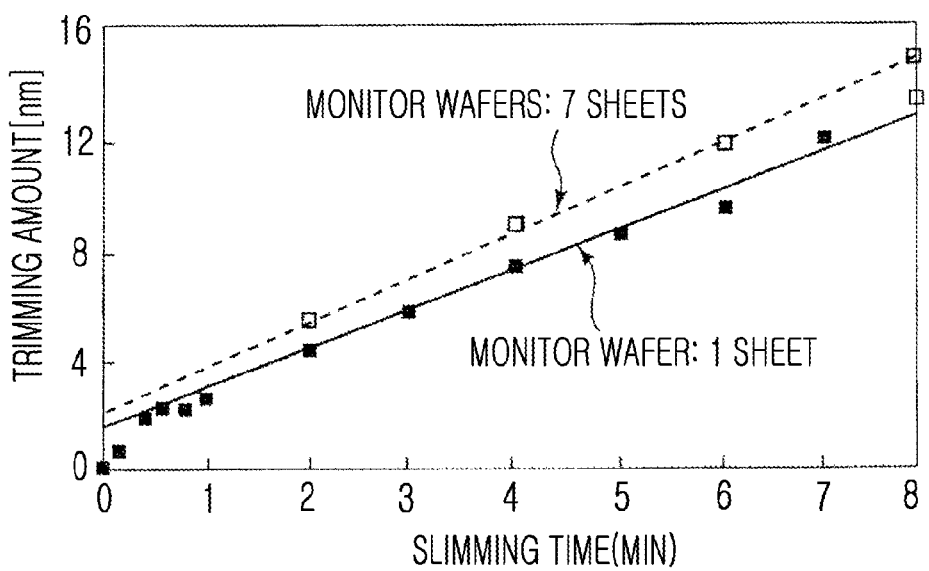

The first verification experiment will be described. FIGS. 6A and 6B are diagrams for illustrating the first verification experiment, that is, FIG. 6A shows that different numbers of wafers are placed on the wafer boats and FIG. 6B is a graph showing variation in the trimming amounts when the slimming process is performed to the different numbers of wafers. In the first verification experiment, the experiment was performed to a case where a monitor wafer W formed of a silicon substrate is placed at a center portion of the wafer boat in a heightwise direction thereof and a case where seven monitor wafers W are placed at the center of the wafer boat in the heightwise direction thereof. The wafer boats are in full capacity states by placing dummy wafers on empty portions of the wafer boats.

On a surface of each of the monitor wafers W in both cases where one monitor wafer W was placed and seven monitor wafers W were placed on the wafer boats, the carbon-containing thin film 104 that is patterned to have a recessed and protruded shape including the recessed portions 104A and the protruded portions 104B as shown in FIG. 3C was formed in advance. The slimming process was performed to the monitor wafer W by using the oxidation apparatus shown in FIGS. 1 and 2 in an $O_2$ plasma atmosphere (no moisture supply).

Here, the variation in the width of the protruded portion 104B of the carbon-containing thin film 104 was obtained from the trimming amount (L1-L2) (refer to FIGS. 3C and 3D). The calculation result is shown in FIG. 6B. As shown in FIG. 6B, the trimming amounts were linearly increased when the slimming time increased in both cases where one monitor wafer W was placed and seven monitor wafers W were placed on the wafer boats. However, increasing tendency of the trimming amount according to the increase of the slimming time when the seven monitor wafers W were placed was greater (inclination was greater) than that when one monitor wafer was placed. This means that the trimming amount is changed according to the number of wafers to be processed, and thus, the reproducibility is degraded. It is considered that the above phenomenon is generated due to the moisture that is the byproduct of the slimming process and/or the moisture supplied into the process chamber by the seven monitor wafers.

Figure 7A:
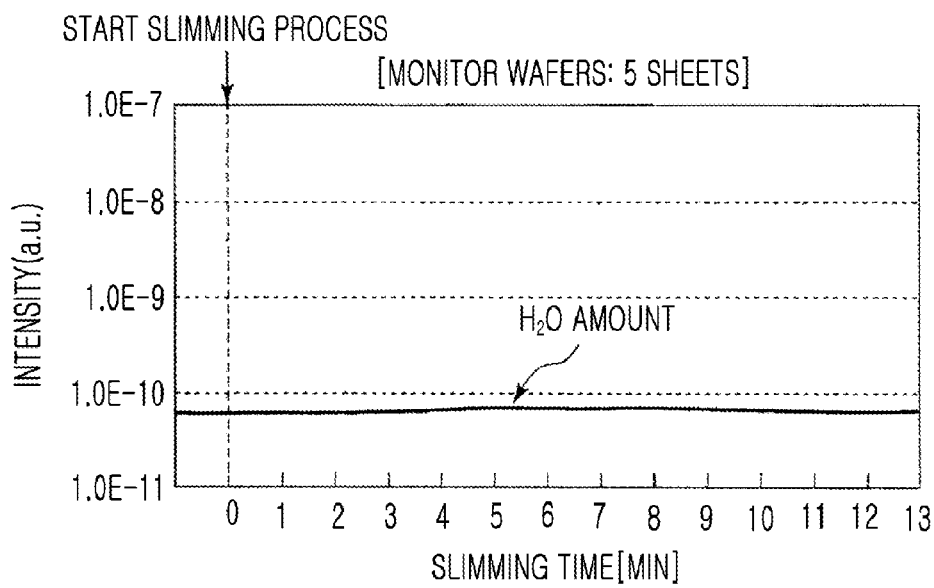
FIGS. 7A and 7B are graphs showing a dependency of an amount of moisture generated during the slimming process onto the number of wafers.
Figure 7B:
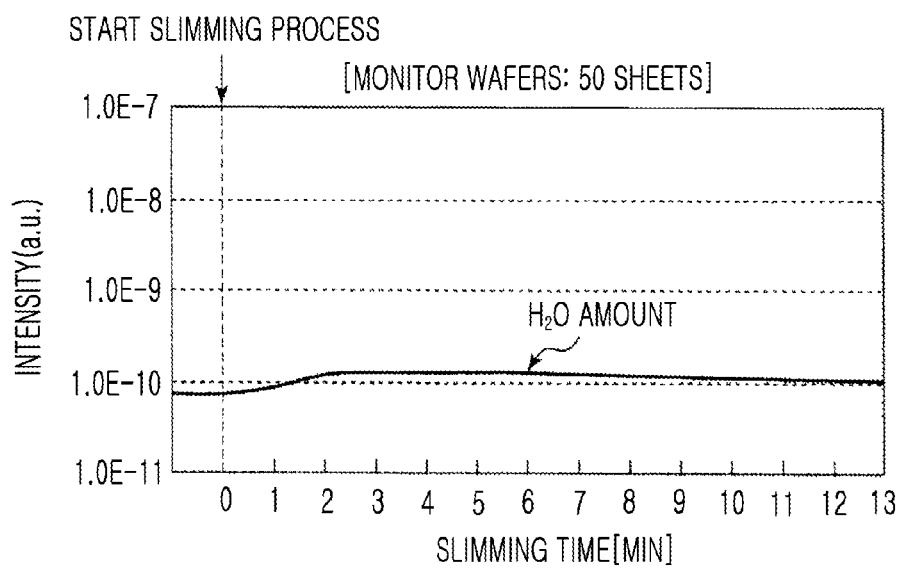

Next, the variation in the moisture amount in the process chamber 4 during the slimming process was actually examined, and the examination result is shown in FIGS. 7A and 7B. Here, five monitor wafers were placed on one wafer boat and fifty monitor wafers were placed on the other wafer boat, and then, the slimming processes to both of the wafer boats were performed.

In addition, the wafer boats were in the full capacity states by placing the dummy wafers on empty portions of the wafer boats. FIGS. 7A and 7B are graphs showing dependencies of the moisture amounts generated in the slimming process onto the number of monitor wafers, that is, FIG. 7A shows the variation of the moisture amount when five monitor wafers are placed on the wafer boat and FIG. 7B shows the variation of the moisture amount when fifty monitor wafers are placed on the wafer boat. In the graphs, longitudinal axes denote "intensity" (standardized intensity of a detector), and the intensity is greater as the moisture amount increases. As shown in FIGS. 7A and 7B, the moisture amount generated from fifth monitor wafers is greater than that generated from five monitor wafers.

Figure 8A:
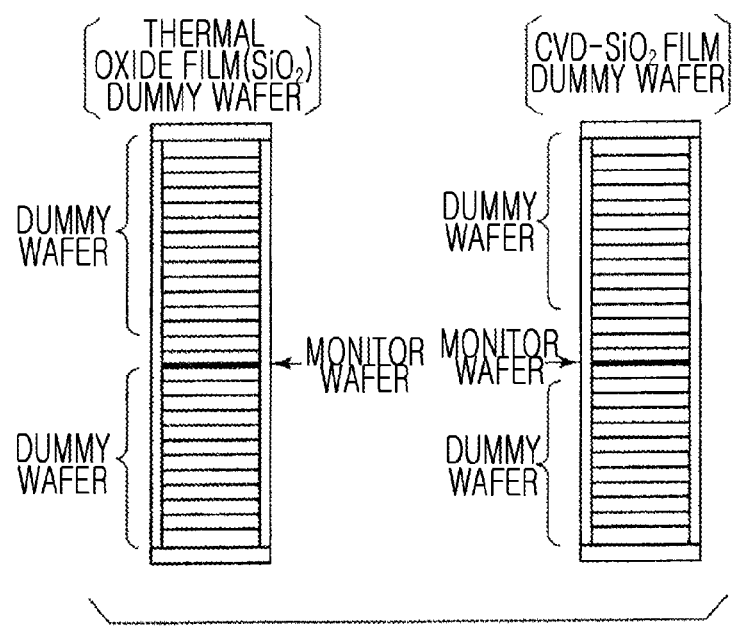
FIGS. 8A and 8B are diagrams for describing a second verification experiment.
Figure 8B:
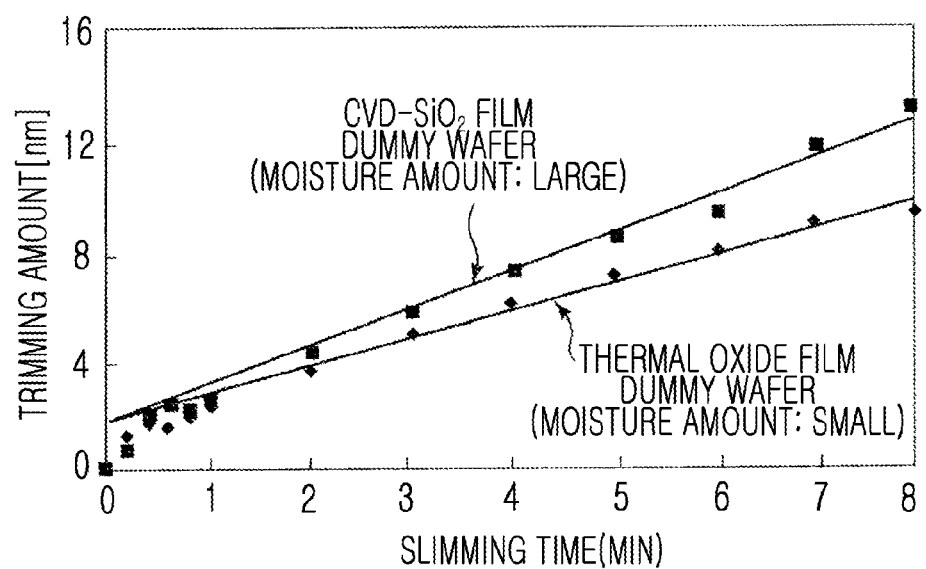

Then, the second verification experiment will be described as follows. FIGS. 8A and 8B are diagrams showing the second verification experiment, that is, FIG. 8A shows a state where dummy wafers containing moisture of different levels are placed on the wafer boats and FIG. 8B is a graph showing variations in the trimming amounts in the slimming processes when the dummy wafers containing moisture of different levels are placed. In the second verification experiment, a monitor wafer W formed of silicon substrate was placed on each of the wafer boats at the center portion in the heightwise direction of the wafer boat, and the dummy wafers were placed on empty portions of each of the wafer boats to make the wafer boats full capacity states.

Here, a thermal oxide film ($SiO_2$) having a thickness of 0.1 μm was formed on a surface of every dummy wafer on one wafer boat by a thermal oxidation process in advance. On the other wafer boat, a $SiO_2$ film having a thickness of 1 μm was formed by a CVD process on a surface of every dummy wafer in advance. In this case, the $SiO_2$ film formed by the thermal oxidation process has less moisture and the $SiO_2$ film formed by the CVD process has greater moisture than the other.

The carbon-containing thin film 104 that is patterned to have a recessed and protruded shape including the recessed portions 104A and the protruded portions 104B as shown in FIG. 3C was formed in advance on the surface of each of the monitor wafers W. The slimming process was performed to the monitor wafer W by using the oxidation apparatus shown in FIGS. 1 and 2 in an $O_2$ plasma atmosphere (no moisture supply).

Here, the variation in the width of the protruded portion 104B of the carbon-containing thin film 104 was obtained from the trimming amount (L1-L2) (refer to FIGS. 3C and 3D). The calculation result is shown in FIG. 8B. As shown in FIG. 8B, the trimming amounts were linearly increased when the slimming time increased in both cases where the thermal oxide film was formed on the dummy wafers and the CVD-$SiO_2$ film was formed on the dummy wafers. However, according to the increase of the slimming time, increasing tendency of the trimming amount when the CVD-$SiO_2$ film was formed on the dummy wafers was greater (inclination was greater) than that when the thermal oxide film was formed on the dummy wafers.

As a result, according to the state of the dummy wafer, that is, when the amount of moisture supplied from outside was large (CVD-$SiO_2$ film), the trimming amount in the slimming process was greater than the case where the amount of moisture is less ($SiO_2$ of the thermal oxide film).

Figure 9:
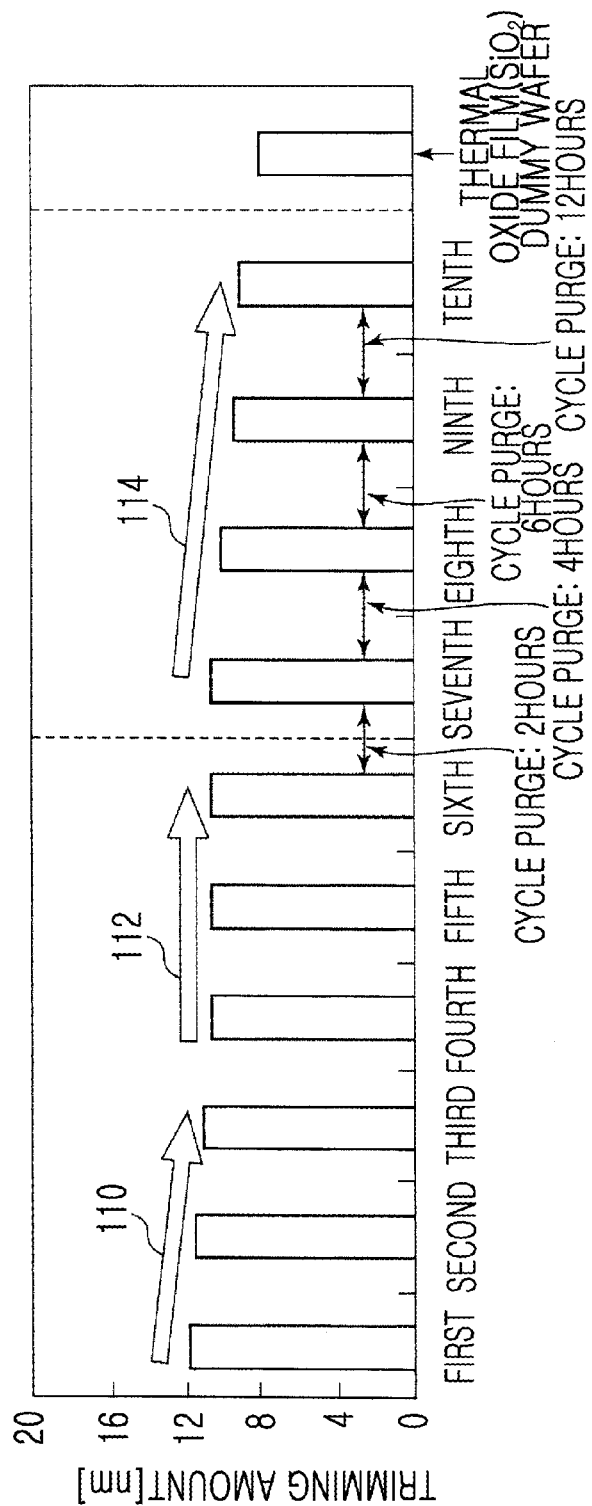
FIG. 9 is a graph showing a variation in the trimming amounts when slimming processes are sequentially performed under an existence of dummy wafers on which CVD-$SiO_2$ films are formed (large amount of moisture)

Here, in order to definitely identify the effect of the amount of moisture supplied into the process chamber, the slimming processes were sequentially performed under existence of the dummy wafers on which the CVD-$SiO_2$ films were formed, and the variation of the trimming amounts was examined. The examination result is shown in FIG. 9. FIG. 9 is a graph showing the variation in the trimming amounts when the slimming processes were sequentially performed under the existence of the dummy wafers on which the CVD-$SiO_2$ films were formed (large moisture amount). Here, a monitor wafer was placed at the center portion of the wafer boat as shown in FIG. 8A, and the dummy wafers on which the $SiO_2$ films were formed by the CVD process were placed on empty portions of the wafer boat to the full capacity state of the wafer boat.

The dummy wafers on which the CVD-$SiO_2$ films were formed were left in the atmosphere for two days before being transferred onto the wafer boat so that a sufficient amount of moisture may be absorbed on the $SiO_2$ films. In a state where the dummy wafers were placed on the wafer boat, the slimming processes were performed sequentially ten times by replacing the monitor wafer placed at the center portion of the wafer boat whenever the slimming processes were performed. FIG. 9 shows the trimming amount in each of the slimming processes.

In addition, from seventh slimming process to tenth slimming process, a cycle purge, in which supply of the inert gas (for example, $N_2$ gas) and vacuum suction were alternately repeated to prompt the evacuation of the atmosphere inside the process chamber, was performed during predetermined times right before the slimming process. The cycle purge was performed for two hours right before the seventh slimming process, for four hours right before the eighth slimming process, for six hours right before the ninth slimming process, and for twelve hours right before the tenth slimming process. In addition, the slimming process was performed for about 15 minutes for each time.

In addition, a right end of FIG. 9 represents a reference value, which is the trimming amount when the dummy wafers (less moisture amount) on which the $SiO_2$ films are formed by the thermal oxidation are placed on empty portions of the wafer boat to the full capacity of the wafer boat. As shown in FIG. 9, in the first through fourth slimming processes, as denoted by an arrow 110 that is slightly inclined toward a lower right portion, the trimming amounts are gradually reduced from about 12 nm to about 10.5 nm. This is because that the amount of moisture drained from the CVD-$SiO_2$ films formed on the dummy wafers was reduced whenever the slimming process was performed.

In addition, in the fourth through sixth slimming processes, as denoted by an arrow 112 toward in the horizontal direction, the trimming amounts are constant at about 10.5 nm. This is because the amount of moisture introduced into the CVD-$SiO_2$ films formed on the surfaces of the dummy wafers between runs of the slimming processes and the amount of moisture drained during the slimming process were balanced.

However, even in the above state, when the cycle purge is performed respectively right before the seventh to tenth slimming processes, as denoted by an arrow 114 that is slightly inclined toward the lower right portion, the trimming amounts are gradually reduced again from about 10.5 nm to about 9 nm. This is because the moisture included in the CVD-$SiO_2$ films was additionally drained by performing the cycle purge, and accordingly, the amount of moisture drained from the CVD-$SiO_2$ films during the slimming processes was gradually reduced, additionally.

However, even when the cycle purge was performed a plurality of times as described above, some degree of moisture was contained in the CVD-$SiO_2$ films. Therefore, the trimming amount of 9 nm, is greater than the trimming amount of 8 nm that is shown in the right end of FIG. 9 in a case where the thermal oxide films ($SiO_2$ films) are formed on the dummy wafers. From the above experiments, the trimming amounts are uneven in each of the slimming processes and the reproducibility is degraded due to the moisture supplied into the process chamber 4 or the moisture generated as the byproduct of the reaction as described above.

<Evaluation of the Slimming Method According to the Present Invention>

Figure 10A:
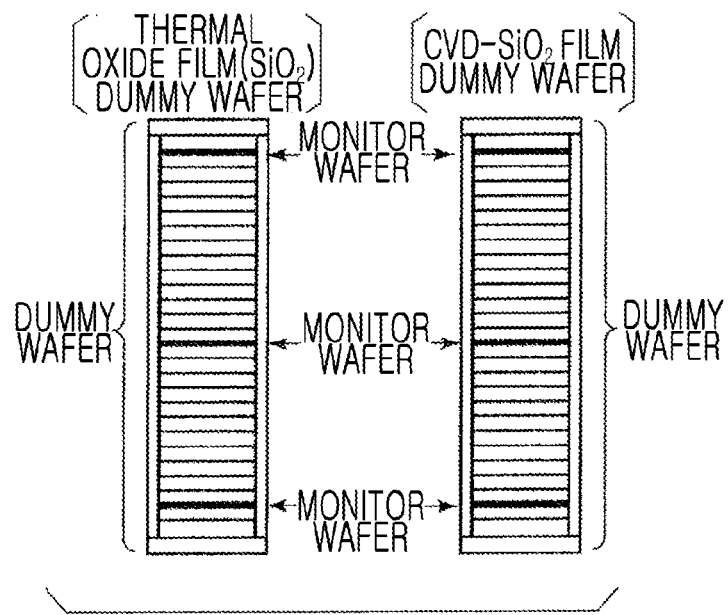
FIGS. 10A and 10B are diagrams for describing an experiment for evaluating the slimming method according to the embodiment of the present invention.
Figure 10B:
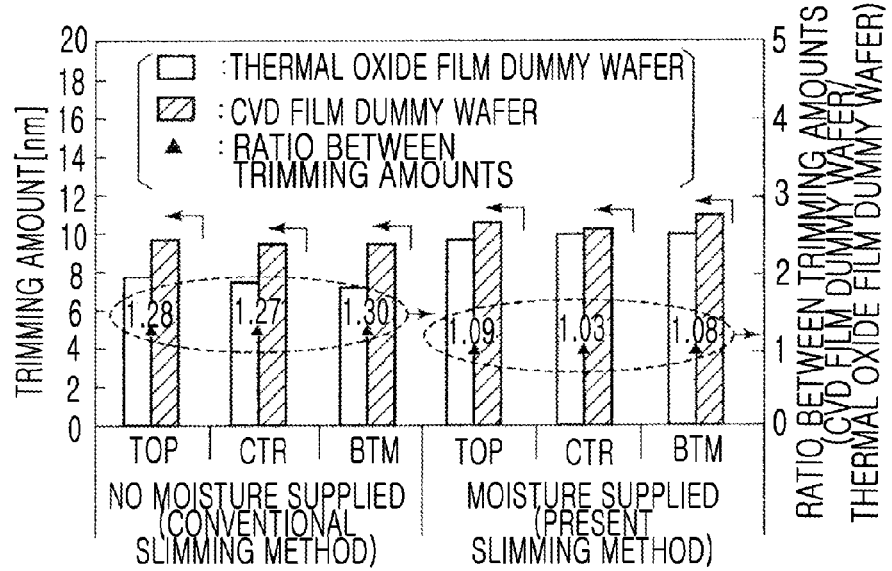

Next, when the slimming process according to the present invention was actually performed, evaluation results will be described as follows. FIGS. 10A and 10B are diagrams for describing an evaluation experiment of the slimming method according to the present invention, that is, FIG. 10A shows a state where dummy wafers containing moisture of different levels are placed on the wafer boats and FIG. 10B is a graph showing variations in the trimming amounts in the slimming processes when the moisture is supplied and when the moisture is not supplied, under the existence of the dummy wafers containing moisture of different levels. The case where the moisture is not supplied corresponds to the conventional slimming method, and the case where the moisture is supplied corresponds to the slimming method according to the present invention. In the evaluation experiment of the present invention, monitor wafers W formed of silicon substrates were respectively placed at a top (TOP), a center (CTR), and a bottom (BTM) of the wafer boat in the heightwise direction of the wafer boat, and the dummy wafers were placed on empty portions of the wafer boats to the full capacity states of the wafer boats.

Here, in one wafer boat, thermal oxide films ($SiO_2$ films) having a thickness of 0.1 µm were formed on surfaces of all dummy wafers in advance. In the other wafer boat, $SiO_2$ films having a thickness of 2 µm were formed on surfaces of all dummy wafers in advance by the CVD process. In these cases, the $SiO_2$ films formed by the thermal oxidation have less moisture amount due to low absorptivity, and the $SiO_2$ films formed by the CVD process have greater moisture amount due to high absorptivity.

The carbon-containing thin film 104 that is patterned to have the recessed and protruded shape including the recessed portions 104A and the protruded portions 104B as shown in FIG. 3C was formed on the surface of each of the monitor wafers W in advance. The slimming process was performed respectively to the monitor wafers by using the oxidation apparatus shown in FIGS. 1 and 2 in the $O_2$ plasma atmosphere in cases where the moisture was supplied and where the moisture was not supplied. When the moisture was supplied, the amount of supplied moisture was 50 sccm.

The variations in the widths of the protruded portions 104B on the carbon-containing thin film 104 were obtained by calculating the trimming amounts (L1−L2) (refer to FIGS. 3C and 3D). The result is shown in FIG. 10B. A longitudinal axis at a left side of the graph shown in FIG. 10B denotes the trimming amount, and the longitudinal axis at a right side of the graph denotes a ratio between the trimming amounts in the dummy wafers of the CVD films and the dummy wafers of the thermal oxide films (CVD film dummy wafers/thermal oxide film dummy wafers).

As shown in a left side of the graph shown in FIG. 10B, in the conventional slimming process in which the moisture was not supplied, the differences between the trimming amounts in the thermal oxide film dummy wafers and the CVD film dummy wafers were large regardless of the TOP, the CTR, and the BTM. In addition, the ratio between the trimming amounts was about 1.27 to 1.30, for example, and thus, the variation amount in the trimming amounts was too large. However, as shown in the right side of the graph shown in FIG. 10B, in the slimming method in which the moisture was supplied according to the present invention, differences between the trimming amounts of the thermal oxide film dummy wafers and the CVD film dummy wafers were very small. In addition, the ratio between the trimming amounts is about 1.03 to about 1.09, for example, and thus, the variation in the trimming amounts was reduced greatly.

Also, in the above embodiment, the oxygen gas is used as the oxidizing gas in the slimming process and the activation is performed by the plasma; however, the present invention is not limited thereto, oxygen may be used as the oxidizing gas so as not to use the plasma. In addition, in the above embodiment, the oxygen is used as the oxidizing gas as an example; however, the present invention is not limited thereto, that is, $H_2O$, NO, $N_2O$, $O_3$, or the like may be used. In addition, in this case, the plasma may be used or not.

When the plasma is not used, the activation unit 66 that generates plasma and accompanied members are not necessary in the oxidation apparatus shown in FIGS. 1 and 2; however, the temperature of the wafers W may be increased in order to improve the oxidation property. Therefore, in this case, the heating unit 94 is essentially provided on the outer circumferential side of the process chamber 4. In this case, the temperature of the wafers W in the slimming process is set as about, for example, 200° C. or greater when the oxidizing gas is the oxygen, and about, for example, 100° C. or greater when the oxidizing gas is ozone and the plasma is not used. In addition, the highest limit of the temperature is, for example, about 850° C. when the thermal CVD carbon films are formed.

In addition, in the above embodiment, the semiconductor wafer is used as the object to be processed, and the semiconductor wafer may include a silicon substrate or a compound semiconductor substrate such as GaAs, SiC, and GaN. Moreover, the object to be processed is not limited to the above substrates, and may be applied to a glass substrate, a ceramic substrate, and the like used in liquid crystal display devices.

According to the sliming method of the carbon-containing thin film and the oxidation apparatus of the present invention, following operational effects may be obtained.

According to the invention of claim 1 and the other claims referring to claim 1, the surface of the carbon-containing thin films is oxidized and removed while supplying moisture into the process chamber, and thus, the widths of the protruded portions on the pattern are reduced. Therefore, the unevenness of the slimming amounts (trimming amounts) in each of the slimming processes may be suppressed regardless of the number of the objects to be processed that are processed at a time, and thus, the reproducibility may be improved.

According to the invention of claim 2 and the other claims referring to claim 2, the moisture is supplied into the process chamber right before the slimming process, and thus, the unevenness of the slimming amounts (trimming amounts) in each of the slimming processes may be suppressed regardless of the number of the objects to be processed that are processed at a time, and thus, the reproducibility may be improved.

According to the invention of claim 3 and the other claims referring to claim 3, the moisture is supplied into the process chamber right before the slimming process, and additionally, the surface of the carbon-containing thin film is oxidized and removed while supplying the moisture into the process chamber, to reduce the widths of the protruded portions on the pattern. Therefore, the unevenness of the slimming amounts (trimming amounts) in each of the slimming processes may be suppressed regardless of the number of the objects to be processed that are processed at a time, and thus, the reproducibility may be improved.

What is claimed is:

1. A slimming method of a carbon-containing thin film, the slimming method comprising:
    transferring an object to be processed on which a patterned carbon-containing thin film is formed into a process chamber in an oxidation apparatus; and
    oxidizing and removing a surface of the carbon-containing thin film by an oxidizing gas while supplying an excessive amount of moisture more than an amount of moisture contained in the object or generated as a byproduct into the process chamber, to reduce widths of protruded portions on the pattern of the carbon-containing thin film.

2. A slimming method of a carbon-containing thin film, the slimming method comprising:
    transferring an object to be processed on which a patterned carbon-containing thin film is formed into a process chamber in an oxidation apparatus;
    supplying an excessive amount of moisture more than an amount of moisture contained in the object or generated as a byproduct into the process chamber; and
    oxidizing and removing a surface of the carbon-containing thin film by an oxidizing gas, to reduce widths of protruded portions on the pattern of the carbon-containing thin film.

3. A slimming method of a carbon-containing thin film, the slimming method comprising:
    transferring an object to be processed on which a patterned carbon-containing thin film is formed into a process chamber in an oxidation apparatus;
    supplying an excessive amount of moisture more than an amount of moisture contained in the object or generated as a byproduct into the process chamber; and
    oxidizing and removing a surface of the carbon-containing thin film by an oxidizing gas while supplying the excessive amount of moisture into the process chamber, to reduce widths of protruded portions on the pattern of the carbon-containing thin film.

4. The slimming method of claim 1, wherein the carbon-containing thin film is a film selected from the group including a resist film, a carbon film, and an anti-reflection film.

5. The slimming method of claim 1, wherein the oxidizing gas is an oxygen containing gas.

6. The slimming method of claim 5, wherein the oxidizing is a plasma oxidation process in an oxygen atmosphere.

7. The slimming method of claim 5, wherein the oxidizing is a thermal oxidation process in an oxygen atmosphere or a thermal oxidation process in an ozone atmosphere.

* * * * *